United States Patent
Hayashi

[11] Patent Number: 5,907,504
[45] Date of Patent: May 25, 1999

[54] MULTIPLE-VALUED MEMORY AND DATA ACCESS METHOD FOR MULTIPLE-VALUED MEMORY

[75] Inventor: Tomohiro Hayashi, Yokohama, Japan

[73] Assignee: Fujitsu Limited, Kawasaki, Japan

[21] Appl. No.: 08/936,613

[22] Filed: Sep. 24, 1997

[30] Foreign Application Priority Data

Feb. 6, 1997 [JP] Japan ................................ 9-024035

[51] Int. Cl.$^6$ .................................................. G11C 16/04
[52] U.S. Cl. .................................. 365/185.03; 365/185.19
[58] Field of Search ........................... 365/185.03, 185.19

[56] References Cited

U.S. PATENT DOCUMENTS 5,621,682  4/1997  Tanzawa et al. ................... 365/185.03
5,687,115  11/1997  Wong et al. ........................ 365/185.03

FOREIGN PATENT DOCUMENTS

4-290380  10/1992  Japan .

Primary Examiner—David Nelms
Assistant Examiner—VanThu Nguyen
Attorney, Agent, or Firm—Staas & Halsey

[57] ABSTRACT

A multiple-valued memory is capable of storing analog quantities which are distinguishable in a plurality of levels, and includes a plurality of memory cells capable of storing n-valued logic values depending on the stored analog quantities, where n is three or greater. The multiple-valued memory is constructed such that correspondences between the analog quantities to be stored by the memory cells and the logic values to be stored in the memory cells are set so that a Hamming distance between two logic values respectively corresponding to an analog quantity having an i-th level and an analog quantity having a (i+1)-th level is one.

18 Claims, 9 Drawing Sheets

MULTIPLE-VALUED MEMORY AND DATA ACCESS METHOD FOR MULTIPLE-VALUED MEMORY

BACKGROUND OF THE INVENTION

The present invention generally relates to multiple-valued memories and data access methods for the multiple-valued memories and, more particularly, to a multiple-valued memory and a data access method therefor which can improve the reliability of data read from the multiple-valued memory.

In multiple-valued memories such as multiple-valued flash memories which store multiple-valued data in a single memory cell, there are demands to improve the control of a plurality of threshold values which are used to discriminate the multiple-valued logic values read from the multiple-valued memory, and to improve the data storage characteristic of the multiple-valued memory.

In the conventional multiple-valued memory, a voltage read from the multiple-valued memory is compared with a plurality of threshold value voltages, so as to judge the multiple-valued logic value corresponding to the read voltage. For example, in the case of the multiple-valued memory capable of storing octal values, eight kinds of threshold value voltages are prepared i.e., defined in advance, and a judgement is made to determine which one of the binary values "000" through "111" corresponds to the logic value of the voltage read from the multi-valued memory depending on the threshold value voltage closest to the read voltage.

However, if the size of the logic values and the size of the threshold values have a linear relationship in the multiple-valued memory described above, the data value of the octal value may erroneously be judged as being "011" even when the data value "100" is being read. In such a case, the Hamming distance between the actual data value "100" and the erroneously read data value "011" becomes "3". In addition, if the actual data value is a maximum value but the erroneously read data values is a minimum value, the Hamming distance between the actual data value and the erroneously read value becomes "2" or greater. In the case of the octal value, for example, if the actual data value is the maximum value "111" but the erroneously read data value is the minimum value "000", the Hamming distance between the actual data value and the erroneously read value becomes "3".

In order to prevent erroneous reading of the data values, it is necessary to carry out an optimum control of the threshold value voltages. But conventionally, no effective and relatively simple method of controlling the threshold value voltages has been proposed.

Moreover, in order to prevent erroneous reading of the data values, it is also necessary to improve the data storage characteristic of the multiple-valued memory. But conventionally, no effective measures have been proposed to improve the data storage characteristic.

On the other hand, when the Hamming distance between the actual data value and the erroneously read data value is "2" or greater, there is a problem in that it is difficult to detect and correct the data error using the error correction code (ECC). Generally, the detection and correction of the data error using the ECC are possible when the Hamming distance between the actual data value and the erroneously read data value is "1", but the reliability of the data error correction is poor when the Hamming distance is "2" or greater.

Accordingly, in the conventional multiple-valued memory, there are problems in that it is difficult to improve the threshold value control method and the data storage characteristic. Further, since no special consideration is given with respect to the relationship of the threshold values and the corresponding logic values, there is a problem in that the reliability of the data error correction is poor even when the data error detection and correction using the ECC are made.

SUMMARY OF THE INVENTION

Accordingly, it is a general object of the present invention to provide a novel and useful multiple-valued memory and data access method for the multiple-valued memory, in which the problems described above are eliminated.

More particularly, it is an object of the present invention to provide a multiple-valued memory and a data access method for the multiple-valued memory, in which the reliability of the read data is improved by making it possible to make a highly reliable data error correction even if the threshold value control method and the data storage characteristic are not perfect.

Another object of the present invention is to provide a multiple-valued memory which is capable of storing analog quantities which are distinguishable in a plurality of levels, the multiple-valued memory comprising a plurality of memory cells capable of storing n-valued logic values depending on the stored analog quantities, where n is three or greater, wherein correspondences between the analog quantities to be stored by the memory cells and the logic values to be stored in the memory cells are set so that a Hamming distance between two logic values respectively corresponding to an analog quantity having an i-th level and an analog quantity having a (i+1)-th level is one. According to the multiple-valued memory of the present invention, the reliability of the read data is improved by making it possible to make a highly reliable data error correction even if the threshold value control method and the data storage characteristic are not perfect.

Still another object of the present invention is to provide a multiple-valued memory comprising a plurality of memory cells, wherein correspondences between analog quantities to be stored by memory cells and the logic values to be stored in the memory cells are set so that a Hamming distance between two logic values respectively corresponding to an analog quantity having a minimum level and an analog quantity having a maximum level is one. According to the multiple-valued memory of the present invention, even if the logic value having the maximum value is erroneously read as the logic value having the minimum value, it is possible to positively correct the data error, thereby further improving the reliability of the read data.

A further object of the present invention is to provide a multiple-valued memory which is capable of storing analog quantities which are distinguishable in a plurality of levels, the multiple-valued memory comprising a plurality of memory cells capable of storing n-valued logic values depending on the stored analog quantities, where n is three or greater, write means for providing, with respect to the memory cells, analog quantities corresponding to logic values which are to be stored in the memory cells, so that a Hamming distance between two logic values respectively corresponding to an analog quantity having an i-th level and an analog quantity having a (i+1)-th level is one, and read means for reading, from the memory cells, the logic values corresponding to the analog quantities stored in the memory cells, so that the Hamming distance between the two logic values respectively corresponding to the analog quantity having the i-th level and the analog quantity having the (i+1)-th level is one. According to the multiple-valued memory of the present invention, the reliability of the read data is improved by making it possible to make a highly reliable data error correction even if the threshold value control method and the data storage characteristic are not perfect.

Another object of the present invention is to provide a data write method for a multiple-valued memory which is capable of storing analog quantities which are distinguishable in a plurality of levels and includes a plurality of memory cells capable of storing n-valued logic values depending on the stored analog quantities, where n is greater than three, the data write method comprising the steps of (a) setting correspondences between the analog quantities to be stored by the memory cells and the logic values to be stored in the memory cells so that a Hamming distance between two logic values respectively corresponding to an analog quantity having an i-th level and an analog quantity having a (i+1)-th level is one, and (b) providing, with respect to the memory cells, the analog quantities corresponding to the logic values to be stored in the memory cells depending on the setting made by the step (a). According to the data write method of the present invention, the reliability of the read data is improved by making it possible to make a highly reliable data error correction even if the threshold value control method and the data storage characteristic are not perfect.

Still another object of the present invention is to provide a data read method for a multiple-valued memory which is capable of storing analog quantities which are distinguishable in a plurality of levels and includes a plurality of memory cells capable of storing n-valued logic values depending on the stored analog quantities, where n is three or greater, the data read method comprising the steps of (a) setting correspondences between the analog quantities stored by the memory cells and the logic values stored in the memory cells so that a Hamming distance between two logic values respectively corresponding to an analog quantity having an i-th level and an analog quantity having a (i+1)-th level is one, and (b) step of reading, from the memory cells, the logic values corresponding to the analog quantities stored by the memory cells, depending on the step (a). According to the data read method of the present invention, the reliability of the read data is improved by making it possible to make a highly reliable data error correction even if the threshold value control method and the data storage characteristic are not perfect.

Other objects and further features of the present invention will be apparent from the following detailed description when read in conjunction with the accompanying drawings.

DESCRIPTION OF THE PREFERRED EMBODIMENTS

First, a description will be given of the operating principle of the present invention.

The problems described above can be solved by setting, with respect to memory cells which are capable of storing n-valued logic values (n>3) depending on analog quantities (for example, amounts of charge or threshold value voltages) which are distinguishable in a plurality of levels, correspondences between the analog quantities to be stored by the memory cells and the logic values to be stored in the memory cells so that a Hamming distance between two logic values respectively corresponding to an analog quantity having an i-th level and an analog quantity having a (i+1)-th level is one. Correspondences between the analog quantities to be stored by memory cells and the logic values to be stored in the memory cells may be set so that a Hamming distance between two logic values respectively corresponding to an analog quantity having a minimum level and an analog quantity having a maximum level is one.

When carrying out a write operation when the relationship of the analog quantities and the logic values are set as described above, a comparison may be made between the logic values to be stored in the memory cells and the logic values corresponding to the analog quantities stored by the memory cells, so as to control the analog quantities provided with respect to the memory cells based on results of the comparison. In other words, when carrying out the write operation, the logic values corresponding to the analog quantities stored by the memory cells are successively read while providing the analog quantities with respect to the memory cells, and a judgement is made to determine whether to continue or end the write operation (providing the analog quantities) by comparing the logic values to be stored in the memory cells and the logic values read from the memory cells.

In the multiple-valued memory, the range of the analog quantity assigned with respect to each logic value is small, and the possibility of erroneously detecting the analog quantity of an adjacent level and reading the logic value corresponding to the analog quantity of this adjacent level is high. For this reason, if the correspondences of the logic values and the analog quantities were set linearly depending on the levels of the analog quantities, as is done conventionally, an error or two or more bits would be generated when the erroneous logic value is read and it would be difficult to detect and correct this error. But according to the present invention, the Hamming distance between the logic values corresponding to the analog quantities within the adjacent levels is one, and even if the logic value corresponding to the analog quantity within the adjacent level is erroneously read, the error generated is only one bit. Therefore, the present invention has an advantage in that the error detection and correction using the ECC is simple.

Hence, according to the present invention, the reliability of the read data is improved by making it possible to make a highly reliable data error correction even if the threshold value control method and the data storage characteristic are not perfect.

In the present invention, the size of the threshold values and the size of the logic values are set to satisfy a non-linear relationship.

More particularly, in the data access method for the multiple-valued memory according to the present invention, a multiple-valued data is stored in a single memory cell, and a multiple-valued logic value read from the memory cell is judged using a plurality of threshold values. A first step sets first through n-th logic values corresponding to first through n-th threshold values which are in an order depending on the size, and a second step writes the multiple-valued data to the memory cell of the multiple-valued memory. When i=1, . . . , n, the first step sets each of the logic values so that the Hamming distance between an i-th logic value corresponding to the i-th threshold value and a (i+1)-th logic value corresponding to the (i+1)-th threshold value is one in binary value.

On the other hand, the multiple-valued memory according to the present invention includes a memory cell array, a write means, or circuit and a read means, or circuit. The memory cell array includes a plurality of memory cells each capable of storing a multiple-valued data. When first through n-th logic values corresponding to first through n-th threshold values which are in an order depending on the size are set, where i=1, . . . , n, the write means writes the data in the memory cell array by setting each of the logic values so that the Hamming distance between an i-th logic value corresponding to the i-th threshold value and a (i+1)th logic value corresponding to the (i+1)-th threshold value is one in binary value. The read means reads the logic value of the data read from the memory cell array by comparing the read data with the first through n-th threshold values.

According to the present invention, the reliability of the read data is improved by making it possible to make a highly reliable data error correction even if the threshold value control method and the data storage characteristic are not perfect.

Figure 1:
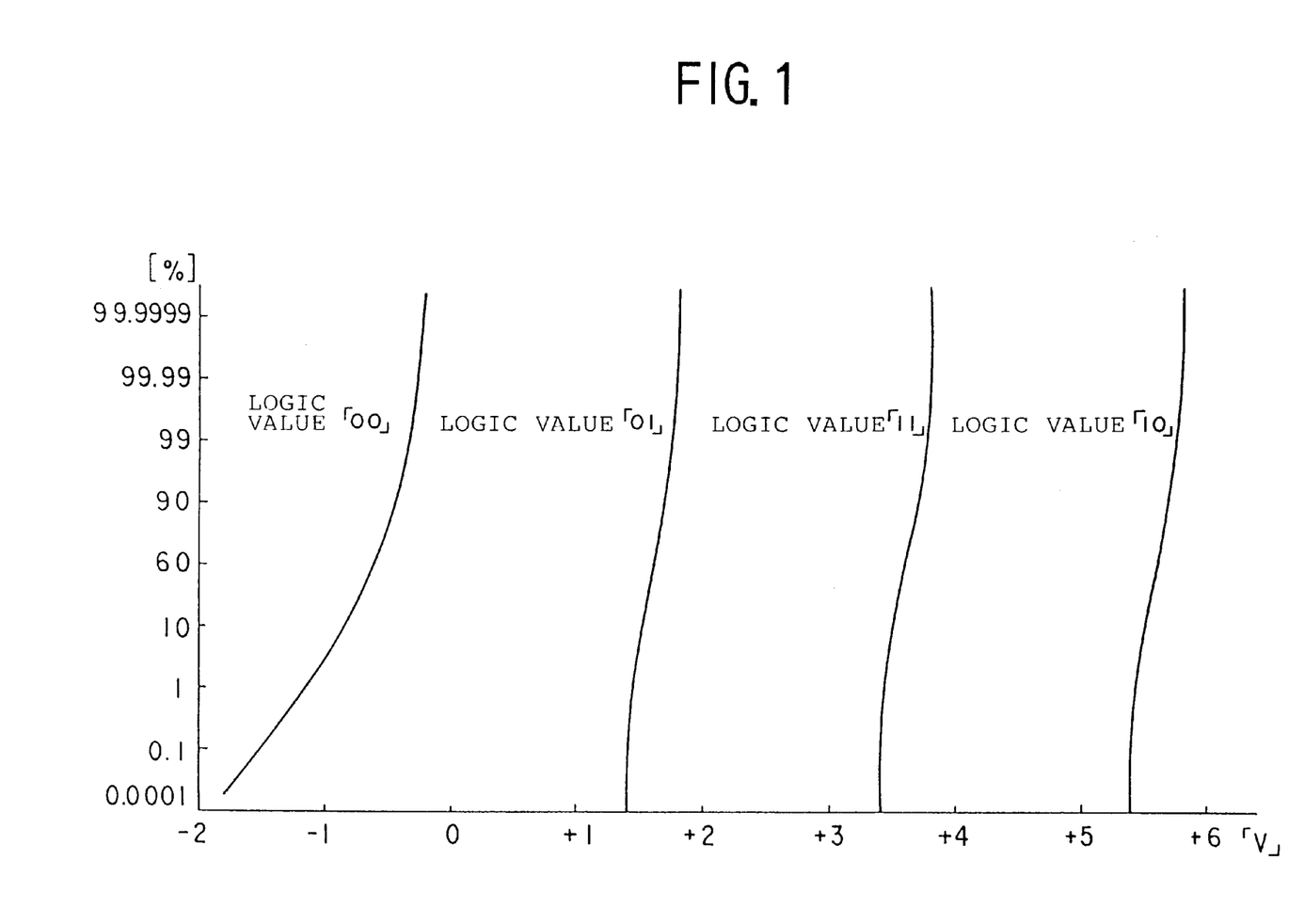
FIG. 1 is a diagram showing the relationship of a plurality of threshold values set in a multiple-valued memory and corresponding logic values in a first embodiment of a data access method for the multiple-valued memory according to the present invention.

Next, a description will be given of a first embodiment of the data access method for the multiple-valued memory according to the present invention, by referring to FIG. 1. FIG. 1 is a diagram showing the relationship of a plurality of threshold values set in the multiple-valued memory and corresponding logic values. The threshold value voltages of the memory cell depend on the amounts of charge stored by the memory cell. The threshold value voltages (amounts of stored charge) are divided into levels depending on the size, and the logic values depending on the levels of the threshold value voltages (amounts of stored charge) are assigned with respect to the memory cell. Each threshold value voltage (amount of stored charge) corresponding to one of the logic values is not a single value, but has a width to a certain extent. In FIG. 1, the ordinate indicates the ratio of the memory cells having a desired threshold value, and the abscissa indicates the threshold value voltage. In this embodiment, the present invention is applied to an n-valued memory for the case where n=4.

In this embodiment, the threshold value voltage of approximately 0 V or less is assigned with respect to the logic value "00" in binary value, the threshold value voltage of approximately +1.5 V is assigned with respect to the logic value "01", the threshold value voltage of approximately +3.5 V is assigned with respect to the logic value "11", and the threshold value voltage of approximately +5.5 V is assigned with respect to the logic value "10". Accordingly, the relationship between the threshold value voltages and the logic values are set so that among the logic values "00", "01", "11" and "10" which are assigned in an order corresponding to that of the size of the threshold value voltages, the Hamming distance between two mutually adjacent logic values always becomes "1". In addition, the Hamming distance between the logic value "10" having a maximum value and the logic value "00" having a minimum value is also "1".

For this reason, even if the data value written in the memory cell of the multiple-valued memory is read as another data value, due to some reason, the actual written data value and the erroneously read data value only differ by "1" in binary value. For example, if the logic value "01" is actually written in the memory cell and this logic value is erroneously read as the data value "11", the Hamming distance between these two logic values is "1". Similarly, even if the logic value "10" having the maximum value is erroneously read as the logic value "00" having the minimum value, the Hamming distance between these two logic values is also "1". In other words, when reading the data values, the voltage of the read data value is compared with a plurality of threshold value voltages, and the logic value of the read data value is judged from the corresponding threshold value voltage. But even if the actually written data value is erroneously read as another data value when reading the data value, the Hamming distance between the logic value of the actually written data value and the logic value of the erroneously read data value is always "1".

Generally, the detection and correction of the data error using the ECC is possible when the Hamming distance between the actual data value and the erroneously read data value is "1", and it is possible to prevent data error of two bits of more. In this embodiment, the relationship between the threshold value voltages and the logic values is set so that among the logic values which are assigned in an order corresponding to that of the size of the threshold value voltages, the Hamming distance between two mutually adjacent logic values is always "1". For this reason, it is unnecessary to take burst error and multiple bit error into consideration, and this embodiment can improve the reliability of the read data by making it possible to make a highly reliable data error correction even if the threshold value control method and the data storage characteristic are not perfect.

Figure 2:
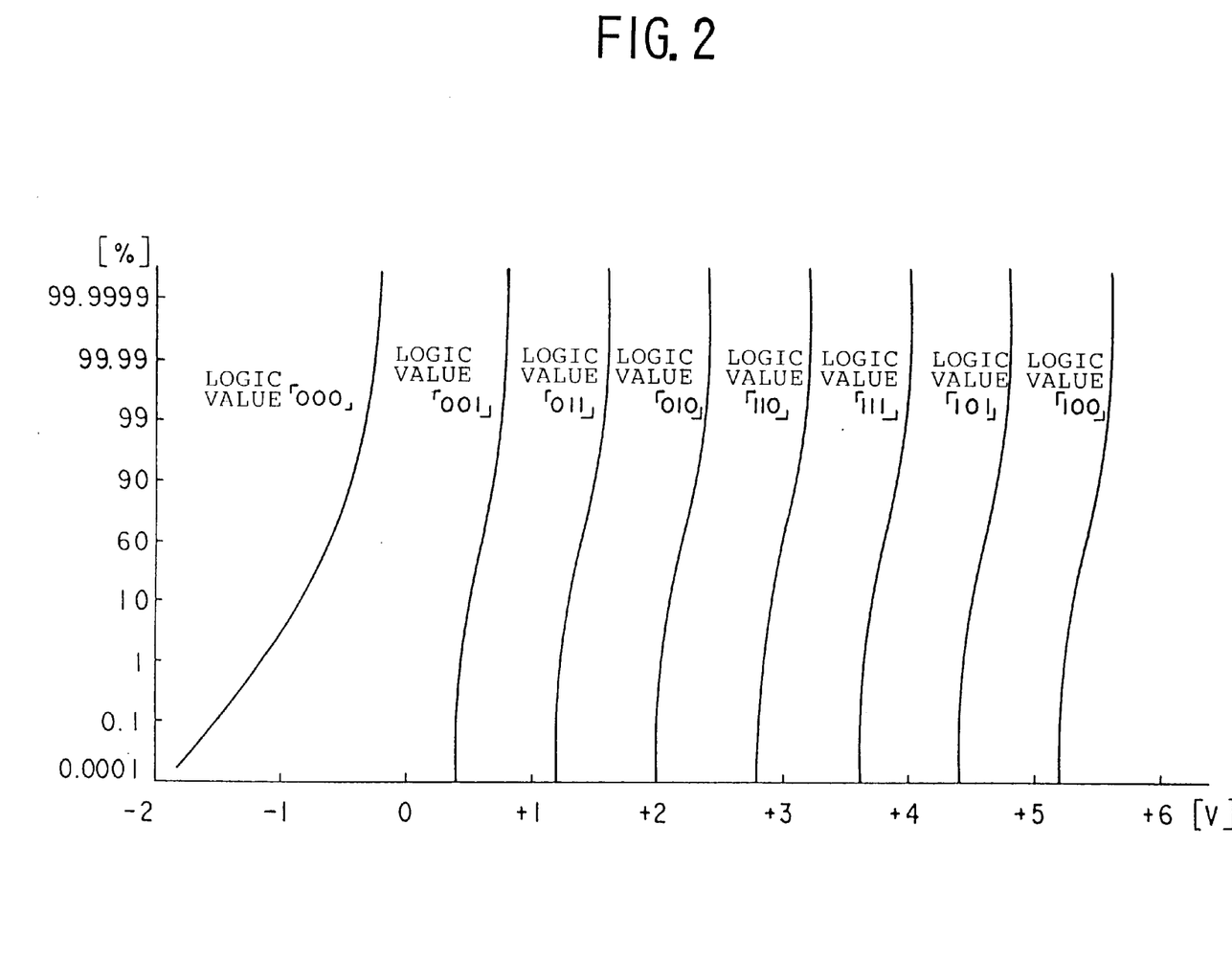
FIG. 2 is a diagram showing the relationship of a plurality of threshold values set in a multiple-valued memory and corresponding logic values in a second embodiment of a data access method for the multiple-valued memory according to the present invention.

Next, a description will be given of a second embodiment of the data access method for the multiple-valued memory according to the present invention, by referring to FIG. 2. FIG. 2 is a diagram showing the relationship of a plurality of threshold values set in the multiple-valued memory and corresponding logic values. In FIG. 2, the ordinate indicates the ratio of the memory cells having a desired threshold value, and the abscissa indicates the threshold value voltage. In this embodiment, the present invention is applied to an n-valued memory for the case where n=8.

In this embodiment, the threshold value voltage of approximately 0 V or less is assigned with respect to the logic value "000" in binary value, the threshold value voltage of approximately +0.5 V is assigned with respect to the logic value "011", the threshold value voltage of approximately +1.5 V is assigned with respect to the logic value "0011", the threshold value voltage of approximately +2.25 V is assigned with respect to the logic value "010", the threshold value voltage of approximately +3.0 V is assigned with respect to the logic value "110", the threshold value voltage of approximately +3.75 V is assigned with respect to the logic value "111", the threshold value voltage of approximately +4.5 V is assigned with respect to the logic value "101", and the threshold value voltage of approximately +5.5 V is assigned with respect to the logic value "100". Accordingly, the relationship between the threshold value voltages and the logic values are set so that among the logic values "000", "001", "011", "010", "110", "111", "101" and "100" which are assigned in an order corresponding to that of the size of the threshold value voltages, the Hamming distance between two mutually adjacent logic values always becomes "1". In addition, the Hamming distance between the logic value "100" having a maximum value and the logic value "000" having a minimum value is also "1".

For this reason, even if the data value written in the memory cell of the multiple-valued memory is read as another data value due to some reason, the actual written data value and the erroneously read data value only differ by "1" in binary value. For example, if the logic value "001" is actually written in the memory cell and this logic value is erroneously read as the data value "011", the Hamming distance between these two logic values is "1". Similarly, even if the logic value "100" having the maximum value is erroneously read as the logic value "000" having the minimum value, the Hamming distance between these two logic values is also "1". In other words, when reading the data values, the voltage of the read data value is compared with a plurality of threshold value voltages, and the logic value of the read data value is judged from the corresponding threshold value voltage. But even if the actually written data value is erroneously read as another data value when reading the data value, the Hamming distance between the logic value of the actually written data value and the logic value of the erroneously read data value is always "1".

As may be seen by comparing FIG. 2 and FIG. 1, the difference between the corresponding threshold value voltages of the two mutually adjacent logic values is extremely small for the n-valued memory when n=8 when compared to that for the n-valued memory when n=4, and the data error is more easily generated when reading the data values from the n-valued memory when n=8. However, as in the case of the first embodiment described above, this embodiment also does not require consideration of the burst error or the multiple bit error, and this embodiment can improve the reliability of the read data by making it possible to make a highly reliable data error correction even if the threshold value control method and the data storage characteristic are not perfect.

Of course, the n-value that can be stored in the n-valued memory is not limited to the cases where n=4 and n=8, and n may take other values greater than or equal to three.

Next, a description will be given of an embodiment of the multiple-valued memory according to the present invention, by referring to FIGS. 3 through 8. In this embodiment, the present invention is applied to a n-valued flash memory, where n=4.

Figure 3:
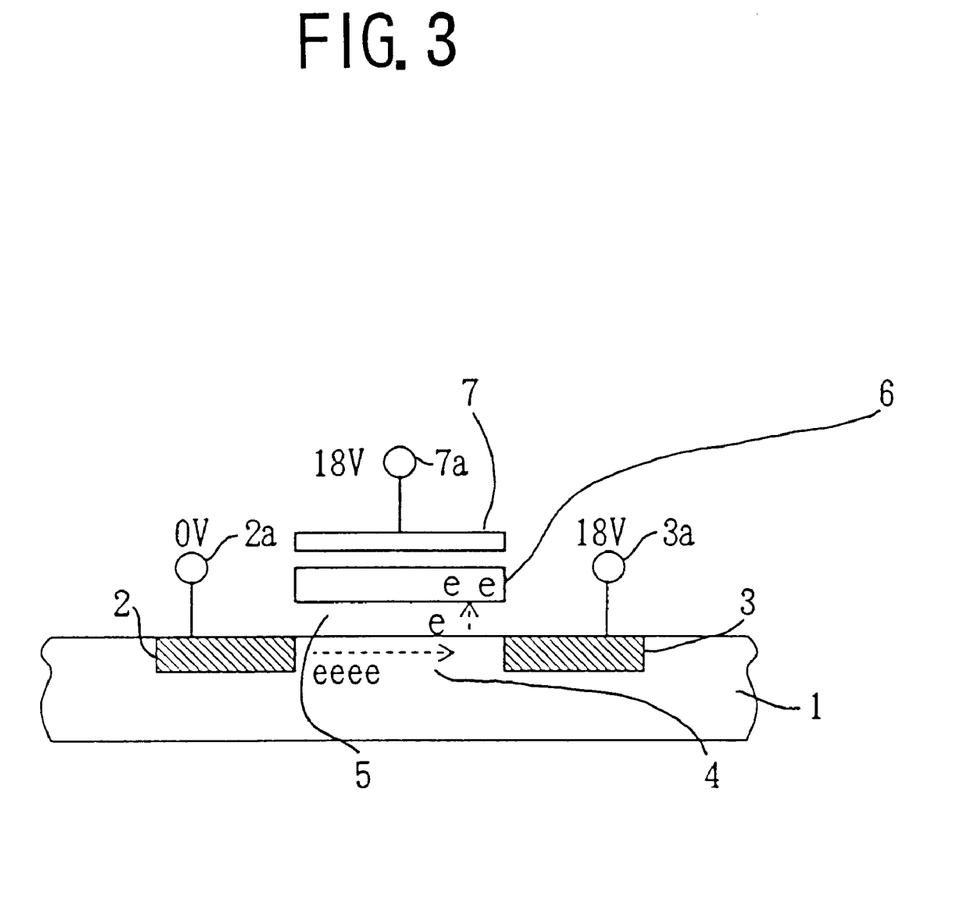
FIG. 3 is a diagram for explaining the operating principle of a write operation of an embodiment of the multiple-valued memory according to the present invention.

FIG. 3 is a diagram for explaining the operating principle of the write operation of the multiple-valued memory, and a cross section of one of a plurality of memory cells forming a memory cell array is shown in a simplified manner. In FIG. 3, the memory cell generally includes a silicon substrate 1, a source region 2, a drain region 3, a channel region 4, a gate oxidation layer 5, a floating gate 6, a control gate 7, a source electrode 2a, a drain electrode 3a, and a gate electrode 7a. The source region 2, the drain region 3 and the channel region 4 are provided in the silicon substrate 1. The floating gate 6 is provided on the channel region 4 between the source region 2 and the drain region 3, via the gate oxidation layer 5.

For example, when a voltage of 0 V is applied to the source electrode 2a and a voltage of approximately 18 V is applied to both the drain electrode 3a and the gate electrode 7a, electrons e flow from the source region 2 to the drain region 3 via the channel region 4 at a high electric field. For this reason, electrons e which can exceed the energy barrier from the surface of the silicon substrate 1 to the gate oxidation layer 5 are generated in a vicinity of the drain region 3, and as a result, electrons e are injected to the floating gate 6. The amount of electrons e that are injected can be controlled by controlling the time for which the above described voltage is applied.

Figure 4:
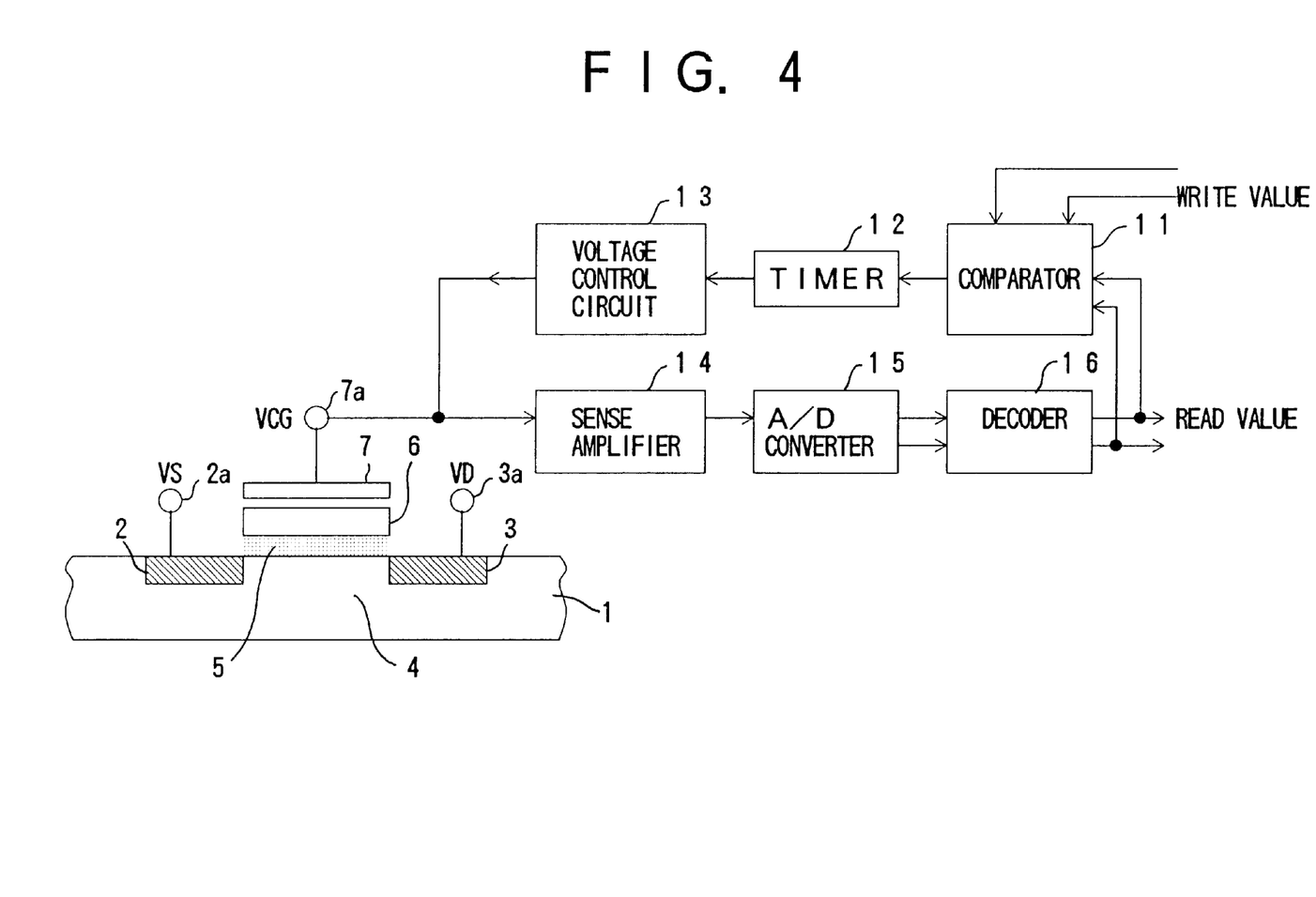
FIG. 4 is a system block diagram showing the construction of a write system.

Next, a description will be given of the operation of a write system of this embodiment, by referring to FIG. 4. FIG. 4 is a system block diagram showing the construction of the write system. In FIG. 4, those parts which are the same as those corresponding parts in FIG. 3 are designated by the same reference numerals, and a description thereof will be omitted. For the sake of convenience, FIG. 4 also shows only one memory cell of the memory cell array.

The write system includes a comparator 11, a timer 12, a voltage control circuit 13, a sense amplifier 14, an analog-to-digital (A/D) converter 15, and a decoder 16 which are connected as shown in FIG. 4. As will be described later, the sense amplifier 14, the A/D converter 15 and the decoder 16 are used in common by a read system.

As described above, the amount of electrons e that are injected to the floating gate 6, that is, the data value that is written, can be controlled by controlling the time for which a voltage VCG is applied to the gate electrode 7a. In addition, it is also possible to control the time for which a voltage VS is applied to the source electrode 2a and the time for which a voltage VD is applied to the drain electrode 3a.

A write value is supplied to the timer 12 via the comparator 11, and the voltage VCG is applied to the gate electrode 7a via the voltage control circuit 13 during a time corresponding to the write value. More particularly, the comparator 11 inputs a write pulse to the timer 12, and the voltage control circuit 13 applies the constant voltage VCG to the gate electrode 7a during a time in which the write pulse is input to the timer 12. The voltage control circuit 13 controls the amplitude of the voltage VCG that is applied to the gate electrode 7a to be constant. On the other hand, a voltage read from the gate electrode 7a is detected by the sense amplifier 14, and is converted into a digital value by the A/D converter 15. The digital value is decoded by the decoder 16, and a corresponding analog value is supplied to the comparator 11 as a read value. The comparator 11 continues to input the write pulse to the timer 12 until the write value and the read value match, so that a charge corresponding to the write value is stored by the floating gate 6.

Figure 5:
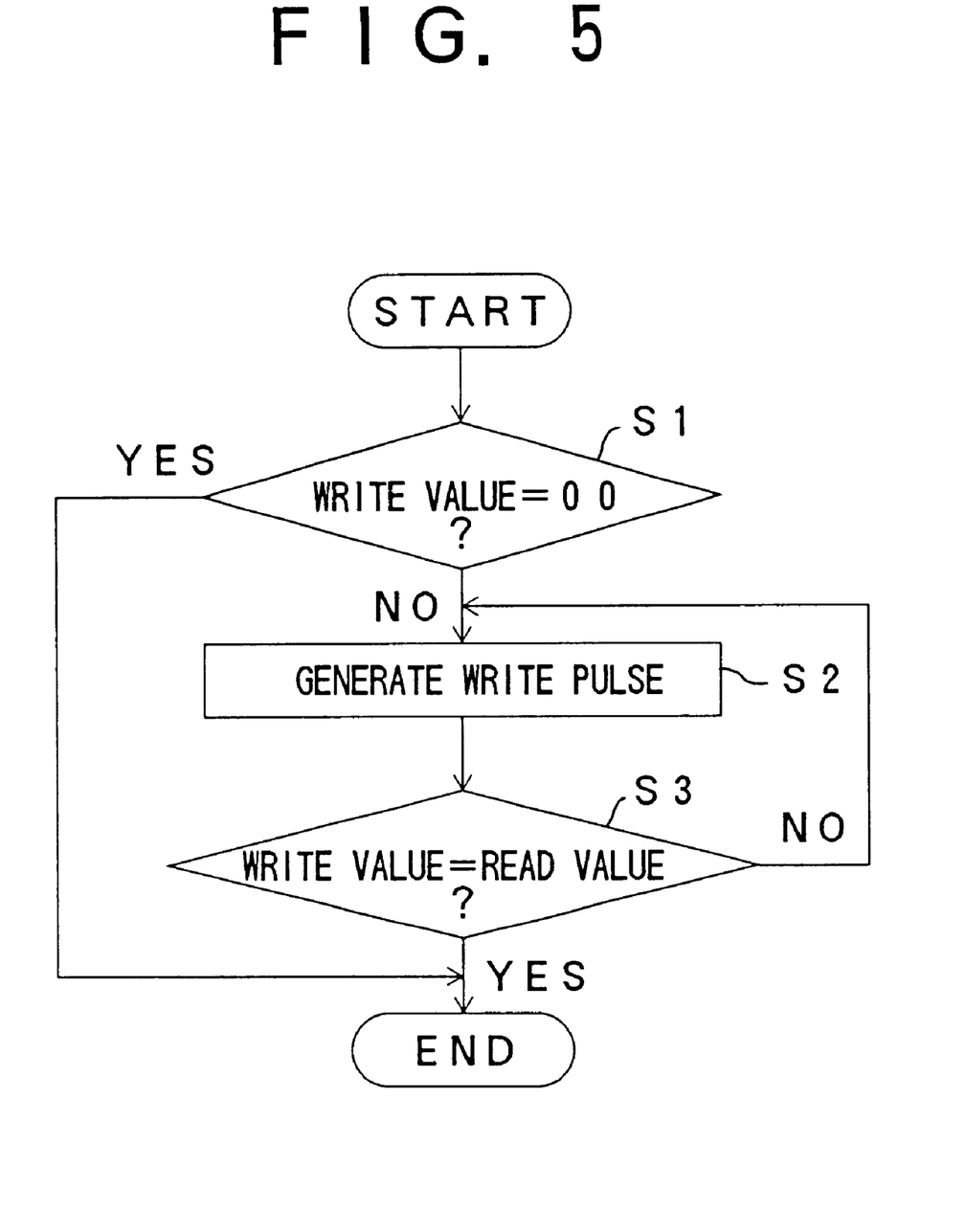
FIG. 5 is a flow chart for explaining the operation of a comparator.

FIG. 5 is a flow chart for explaining the operation of the comparator 11. In FIG. 5, a step S1 decides whether or not the write value is "00" in binary value, and the process ends if the decision result in the step S1 is YES. On the other hand, if the decision result in the step S1 is NO, a step S2 generates the write pulse, and a step S3 decides whether or not the write value is equal to the read value from the decoder 16. If the decision result in the step S3 is NO, the process returns to the step S2. On the other hand, the process ends if the decision result in the step S3 is YES.

FIGS. 6A through 6D respectively are diagrams for explaining the operating principle of a read operation of the multiple-valued memory, and a cross section of one of a plurality of memory cells forming the memory cell array is shown in a simplified manner. In FIGS. 6A through 6D, those parts which are the same as those corresponding parts in FIG. 4 are designated by the same reference numerals, and a description thereof will be omitted.

Figure 6A:
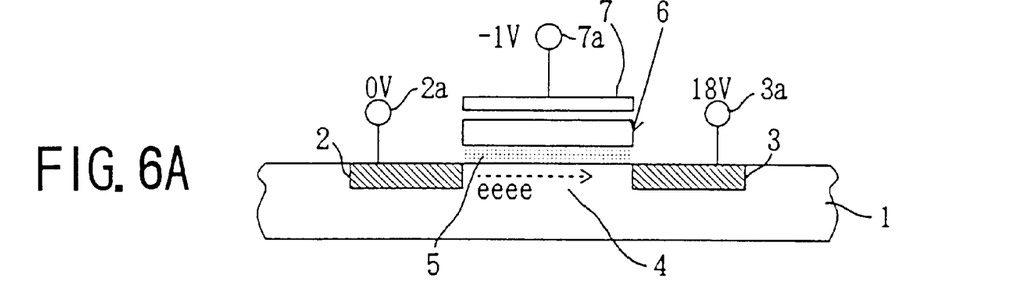
FIGS. 6A through 6D respectively are diagrams for explaining the operating principle of a read operation.

FIG. 6A shows a state where no charge is stored by the floating gate 6. In this state, holes are induced in the channel region 4 by the voltage VCG applied to the gate electrode 7a and a current starts to flow. In a state where no electrons e exist, a current starts to flow when the voltage VCG is on the order of approximately −1 V. A threshold value voltage Vth in this case is approximately −1 V.

Figure 6B:
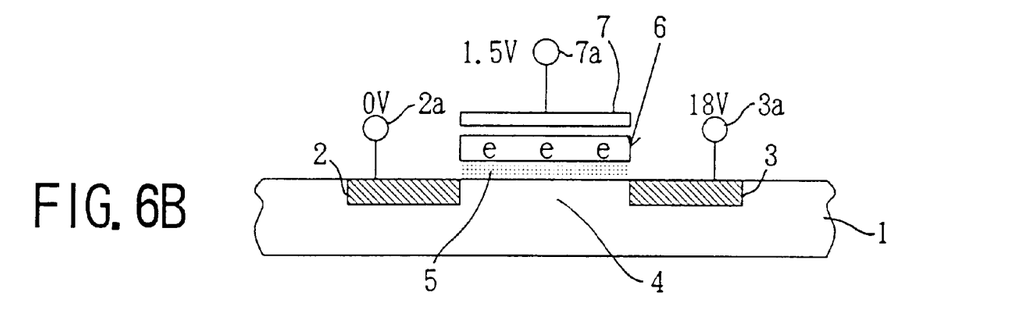
Figure 6C:
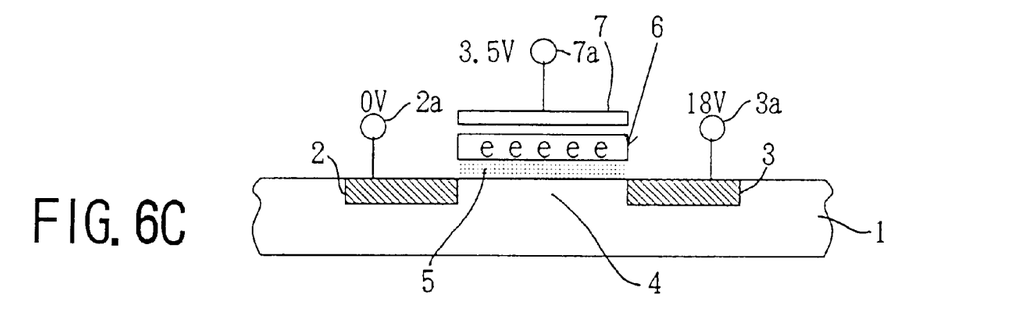
Figure 6D:
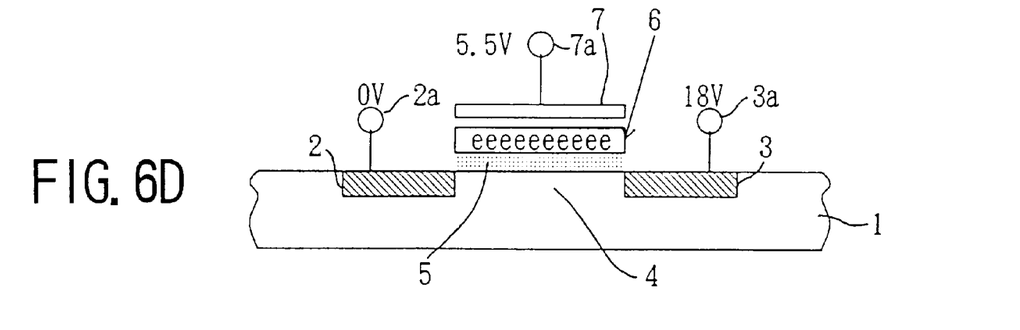

On the other hand, in states where charges are stored by the floating gate 6 as shown in FIGS. 6B through 6D, the voltage VCG applied to the gate electrode 7a is first captured by the electrons e of the floating gate 6 and does not affect the channel region 4.

Accordingly, in the state shown in FIG. 6B, in order for the holes to be induced in the channel region 4 to start a current flow, the voltage VCG applied to the gate electrode 7a must be approximately +1.5 V, and the threshold value voltage Vth in this case is approximately +1.5 V.

In the state shown in FIG. 6C, in order for the holes to be induced in the channel region 4 to start a current flow, the voltage VCG applied to the gate electrode 7a must be approximately +3.5 V, and the threshold value voltage Vth in this case is approximately +3.5 V.

In addition, in the state shown in FIG. 6D, in order for the holes to be induced in the channel region 4 to start a current flow, the voltage VCG applied to the gate electrode 7a must be approximately +5.5 V, and the threshold value voltage Vth in this case is approximately +5.5 V.

Figure 7:
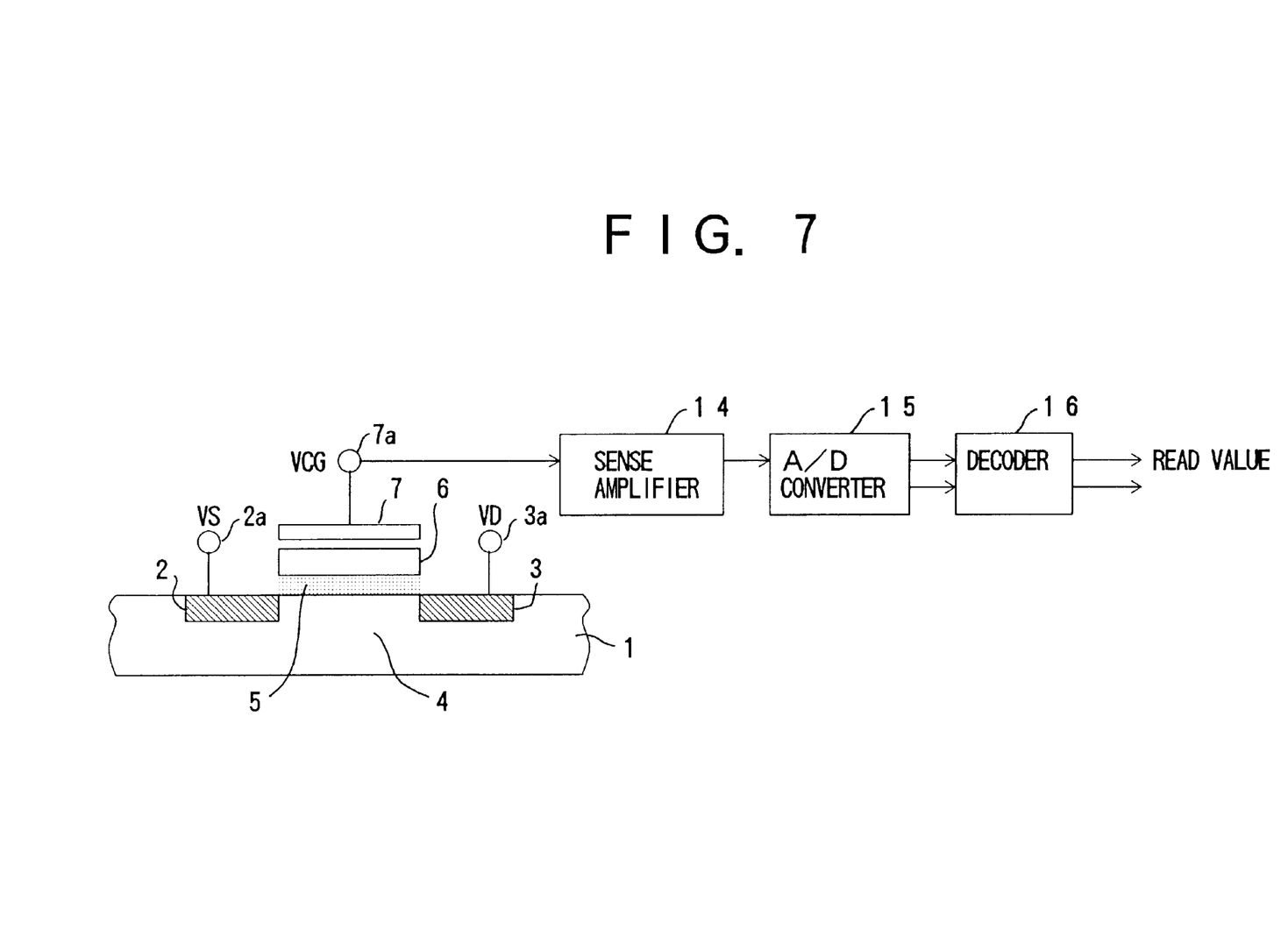
FIG. 7 is a system block diagram showing the construction of a read system.

Next, a description will be given of the operation of a read system of this embodiment, by referring to FIG. 7. FIG. 7 is a system block diagram showing the construction of the read system. In FIG. 7, those parts which are the same as those corresponding parts in FIG. 4 are designated by the same reference numerals, and a description thereof will be omitted. For the sake of convenience, FIG. 7 also shows only one memory cell of the memory cell array.

The read system includes the sense amplifier 14, the A/D converter 15, and the decoder 16 which are connected as shown in FIG. 7. At the time of the writing, the threshold value voltage Vth of approximately −1 V is assigned with respect to the binary digital logic value "00", the threshold value voltage Vth of approximately +1.5 V is assigned with respect to the logic value. "01", the threshold value voltage Vth of approximately +3.5 V is assigned with respect to the logic value "11", and the threshold value voltage Vth of approximately +5.5 V is assigned with respect to the logic value "10". Accordingly, the decoder 16 decodes the digital value obtained via the A/D converter 15 into the corresponding logic value based on the above described assignment of the logic values. In addition, the decoded logic value is subjected to a known error detection and correction processes using the error correction code (ECC), and the error of the read data is positively corrected.

Figure 8:
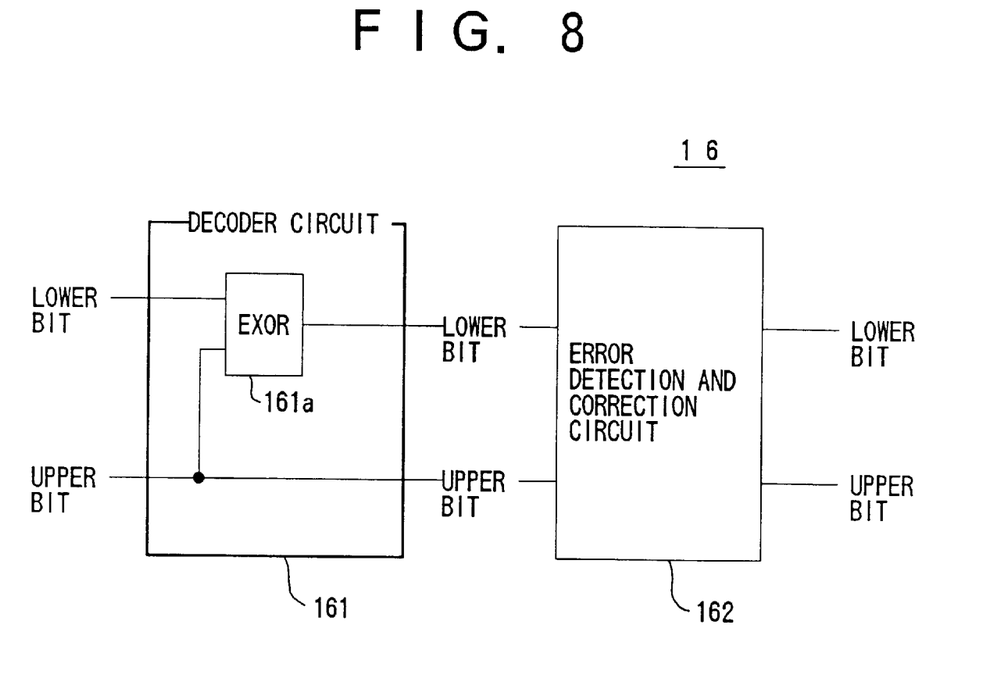
FIG. 8 is a system block diagram showing an embodiment of the construction of a decoder.

FIG. 8 is a system block diagram showing an embodiment of the construction of the decoder 16. In FIG. 8, the decoder 16 includes a decoder circuit 161 made up of an exclusive-OR circuit 161a, and an error detection and correction circuit 162. An upper bit and a lower bit of the digital value output from the A/D converter 15 are input to the exclusive-OR circuit 161a. An output of the exclusive-OR circuit 161a is input to the decoder 161 as a lower bit output. The upper bit of the digital value output from the A/D converter 15 is also input to the error detection and correction circuit 162 via the decoder circuit 161 as an upper bit output. The error detection and correction circuit 162 itself has a known construction, and carries out known error detection and correction processes with respect to the output bits of the decoder circuit 161 so as to prevent a data error of two or more bits.

Figure 9:
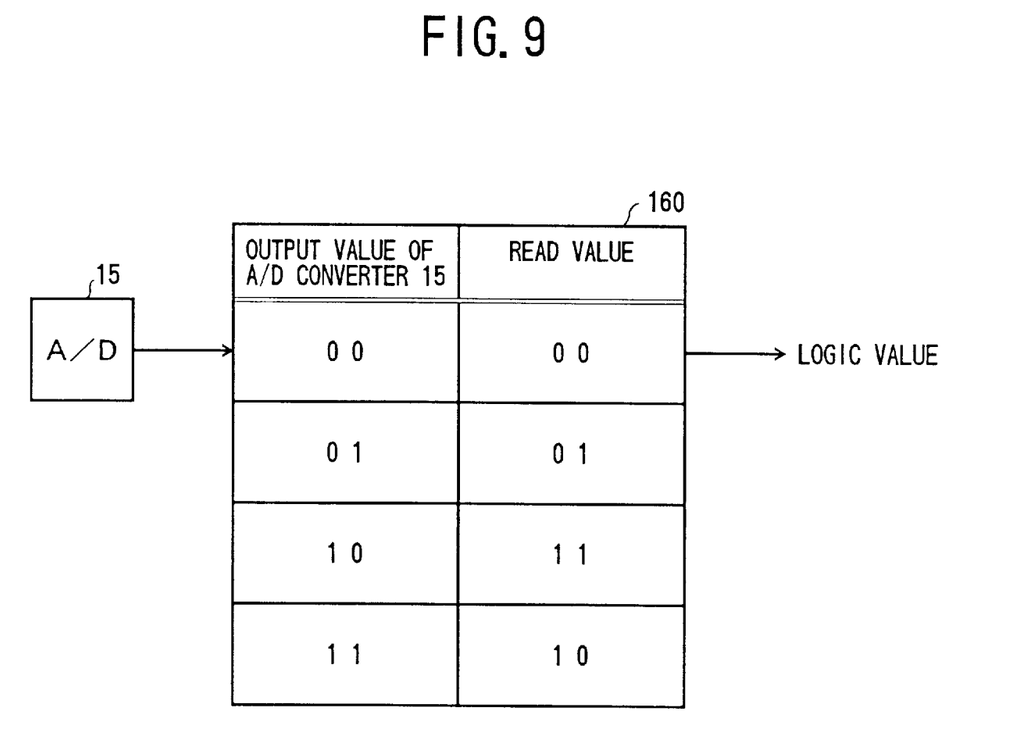
FIG. 9 is a block diagram showing a table used by the decoder.

Of course, the decoder 16 shown in FIG. 7 may be constructed to use a table as shown in FIG. 9 for converting the digital value output from the A/D converter 15 into the corresponding logic value. In FIG. 9, a conversion table 160 stores logic values corresponding to the digital values output from the A/D converter 15. More particularly, the digital value output from the A/D converter 15 is used to make access to a corresponding address of the table 160, and the logic value stored at the accessed address of the table 160, that is, the read value, is output from the table 160. In FIG. 9, the digital value output from the A/D converter 15 is used as the accessing address of the table 160.

The application of the present invention is not limited to the flash memory, and the present invention is similarly applicable to various kinds of memories which can store analog quantities, such as a DRAM, EPROM and EEPROM.

Further, the present invention is not limited to these embodiments, but various variations and modifications may be made without departing from the scope of the present invention.

What is claimed is:

1. A multiple-valued memory comprising:
   a plurality of memory cells;
   wherein correspondences between analog quantities to be stored by memory cells and the logic values to be stored in said memory cells are set so that a Hamming distance between two logic values respectively corresponding to an analog quantity having a minimum level and an analog quantity having a maximum level is one.

2. A multiple-valued memory which is capable of storing analog quantities which are distinguishable in a plurality of levels, said multiple-valued memory comprising:
   a plurality of memory cells capable of storing n-valued logic values depending on the stored analog quantities where n is three or greater;
   write means for providing, with, respect to the memory cells, analog quantities corresponding to logic values which are to be stored in the memory cells, so that a Hamming distance between two logic values respectively corresponding to an analog quantity having an i-th level and an analog quantity having a (i1)-th level is one and so that a Hamming distance between two logic values respectively corresponding to an analog quantity having a minimum level and an analog quantity having a maximum level is one; and
   read means for reading from the memory cells, the logic values corresponding to the analog quantities stored in said memory cells, so that the Hamming distance between the two logic values respectively corresponding to the analog quantity having the i-th level and the analog quantity having the (i+1)-th level is one.

3. A multiple-valued memory which is capable of storing analog quantities which are distinguishable in a plurality of level, said multiple-valued memory comprising:

a plurality of memory cells capable of storing n-valued logic values depending on the stored analog quantities, where n is three or greater;

write means for providing, with respect to the memory cells, analog quantities corresponding to logic values which are to be stored in the memory cells, so that a Hamming distance between two logic values respectively corresponding to an analog quantity having an i-th level and an analog quantity having a (i+1)-th level is one; and read means for reading, from the memory cells, the logic values corresponding to the analog quantities stored in said memory cells, so that the Hamming distance between the two logic values respectively corresponding to the analog quantity having the i-th level and the analog quantity having the (i+1)-th level is one and so that the Hamming distance between two logic values respectively corresponding to an analog quantity having a minimum level and an analog quantity having a maximum level is one.

4. The multiple-valued memory as claimed in 2, wherein said write means includes a means for converting logic values to be stored in the memory cells into digital quantities corresponding to the analog quantities provided with respect to said memory cells.

5. The multiple-valued memory as claimed in claim 3, wherein said read means includes detection means for detecting the analog quantities stored by the memory cells, means for converting said analog quantities into digital quantities, and means for converting said digital quantities into the logic values stored in said memory cells.

6. The multiple-valued memory as claimed in claim 2, wherein said write means compares the logic values to be stored in the memory cells and the logic values which are read from said memory cells by said read means, and controls the analog quantities provided with respect to said memory cells based on results of the comparison.

7. The multiple-valued memory as claimed in claim 2, wherein the analog quantities are amounts of charge to be stored by the memory cells.

8. The multiple-valued memory as claimed in claim 5, wherein said detection means for detecting the analog quantities detects threshold value voltages of the memory cells.

9. A data write method for a multiple-valued memory which is capable of storing analog quantities which are distinguishable in a plurality of levels and includes a plurality of memory cells capable of storing n-valued logic values depending on the stored analog quantities, where n is greater than three, said data write method comprising the steps of:

(a) setting correspondences between the analog quantities to be stored by the memory cells and the logic values to be stored in said memory cells so that a Hamming distance between two logic values respectively corresponding to an analog quantity having an i-th level and an analog quantity having a (i+1)-th level is one and so that a Hamming distance between two logic values respectively corresponding to an analog quantity having a minimum level and an analog quantity having a maximum level is one; and (b) providing, with respect to the memory cells, the analog quantities corresponding to the logic values to be stored in said memory cells depending on the setting made by said step (a).

10. The data write method for the multiple-valued memory as claimed in claim 9, said step (b) includes a step of reading from the memory cells the logic values corresponding to the analog quantities stored in said memory cells according to said step (a), a step of comparing the read logic values and the logic values to be stored in said memory cells, and a step of controlling the analog quantities provided with respect to said memory cells depending on results of the comparison.

11. The data write method for the multiple-valued memory as claimed in claim 9, said step (a) includes a step of converting the analog quantities to be stored by the memory cells into digital quantities, and a step of making the digital quantities correspond to the logic values to be stored in said memory cells.

12. The data write method for the multiple-valued memory as claimed in claim 9, the analog quantities are charge quantities to be stored by the memory cells.

13. The data write method for the multiple-valued memory as claimed in claim 10, said step (a) makes threshold value voltages of the memory cells which are dependent on charge quantities to be stored by said memory cells correspond to the logic values to be stored in said memory cells.

14. A data read method for a multiple-valued memory which is capable of storing analog quantities which are distinguishable in a plurality of levels and includes a plurality of memory cells capable of storing n-valued logic values depending on the stored analog quantities, where n is three or greater, said data read method comprising the steps of:

(a) setting correspondences between the analog quantities stored by the memory cells and the logic values stored in said memory cells so that a Hamming distance between two logic values respectively corresponding to an analog quantity having an i-th level and an analog quantity having a (i+1)-th level is one and so that a Hamming distance between two logic values respectively corresponding to an analog quantity having a minimum level and an analog quantity having a maximum level is one; and (b) reading, from the memory cells, the logic values corresponding to the analog quantities stored by said memory cells, depending on said step (a).

15. The data read method for the multiple-valued memory as claimed in claim 14, wherein said step (a) includes a step of converting the analog quantities stored by the memory cells into digital quantities, and a step of making the digital quantities correspond to the logic values stored in said memory cells.

16. The data read method for the multiple-valued memory as claimed in claim 14, wherein the analog quantities are amounts of charge stored by the memory cells.

17. The data read method for the multiple-valued memory as claimed in claim 14, wherein said step (a) makes threshold values of the memory cells depending on amounts of charge stored by said memory cells correspond to the logic values stored in said memory cells.

(a) setting correspondences between the analog quantities stored by the memory cells and the logic values stored in said memory cells so that a Hamming distance between two logic values respectively corresponding to an analog quantity having an i-th level and an analog quantity having a (i+1)-th level is one and so that a Hamming distance between two logic values respectively corresponding to an analog quantity having a minimum level and an analog quantity having a maximum level is one; and (b) reading, from the memory cells, the logic values corresponding to the analog quantities stored by said memory cells, depending on said step (a).

18. The multiple-valued memory as claimed in claim 3, wherein the analog quantities are amounts of charge to be stored by the memory cells.

* * * * *

UNITED STATES PATENT AND TRADEMARK OFFICE
CERTIFICATE OF CORRECTION

PATENT NO.: 5,907,504
DATED : May 25, 1999
INVENTOR(S): Tomohiro HAYASHI

It is certified that error appears in the above-identified patent and that said Letters Patent is hereby corrected as shown below:

Col. 10,  line 55, delete "," (second occurrence);
line 60, change "(i1)" to --(i + 1)--.

Col. 13,  lines 3-10, delete in its entirety.

Col. 14,  lines 1-5, delete in its entirety.

Signed and Sealed this

Twenty-fifth Day of January, 2000

Attest:

Attesting Officer

Acting Commissioner of Patents and Trademarks